United States Patent [19]

Yamamoto et al.

[11] Patent Number: 4,812,773
[45] Date of Patent: Mar. 14, 1989

[54] FILTER ADJUSTMENT APPARATUS AND METHOD

[75] Inventors: Yoshihiro Yamamoto, Tokyo; Tsutomu Kume, Ibaraki; Nobuo Yamazaki; Fumiharu Hashimoto, both of Tokyo; Koichi Ohya, Kanagawa, all of Japan

[73] Assignee: Sony Corporation, Tokyo, Japan

[21] Appl. No.: 138,516

[22] Filed: Dec. 28, 1987

[30] Foreign Application Priority Data

Dec. 27, 1986 [JP] Japan .................. 61-315052

[51] Int. Cl.$^4$ .................. H03B 1/04; H03K 5/00
[52] U.S. Cl. .................. 328/167; 307/520; 307/556
[58] Field of Search .................. 328/167; 307/520, 555, 307/556, 568

[56] References Cited

U.S. PATENT DOCUMENTS

| | | | |
|---|---|---|---|
| 3,714,588 | 1/1973 | Deboo et al. | 328/167 |
| 3,753,159 | 8/1973 | Burwen | 328/167 |
| 3,978,416 | 8/1976 | Sutphin, Jr. | 328/167 |
| 3,978,420 | 8/1976 | Lane | 328/167 |
| 4,045,731 | 8/1977 | Tokunou et al. | 328/167 |
| 4,207,543 | 6/1980 | Izakson et al. | 328/167 |

OTHER PUBLICATIONS

"Digital Control of Active Filter Characteristics", by J. J. Hill, 6-28-76, International Journal Electronics, vol. 41, No. 4, 405–410.

"Self-Tuning Active Low Pass Filter", by Tarasov et al., Instrument & Exp. Tech., vol. 22, No. 1, Jan.-Feb. 1979.

"Systems Applications for Voltage Controlled Active Filters", by Harvey, EEE, Oct. 1969.

Primary Examiner—Stanley D. Miller
Assistant Examiner—Richard Roseen

[57] ABSTRACT

Filter adjustment apparatus for adjusting cut-off frequencies or dip frequencies, for example, may be adjusted to desired optimum properties, during application of an input signal of a constant frequency. The optimum filter adjustment data are found, based on data manifested when the level detected output of the filter output crosses a prescribed reference level whereby the filter adjustment operation is simplified and accuracy is improved with a simplified structure, and it is possible to achieve automatic adjustment of the filter characteristics.

7 Claims, 4 Drawing Sheets

FILTER ADJUSTMENT APPARATUS AND METHOD

BACKGROUND OF THE INVENTION

1. Field of the Invention

This invention relates to filter adjustment apparatus and to a method for adjusting cut-off frequencies, peak frequencies, or dip frequencies, for example, of a filter provided in an integrated circuit (IC).

2. Description of the Prior Art

In a check process for electronic circuits in general, it may become necessary to adjust the peak frequency, dip frequency or the cut-off frequency of the filter circuit to a prescribed target value. Above all, in a circuit formed in an analog integrated circuit or analog IC, while the circuit elements such as transistors, resistors or capacitors can be fabricated with a highly accurate relative ratio of the rated values thereof, the absolute values or magnitudes of these rated values vary from circuit to circuit. Hence, the aforementioned adjustment is thought to be indispensable in the filter circuit wherein a demand is raised for high accuracy.

In the conventional filter adjustment, it is usual to detect a filter output while consecutively changing or sweeping the frequency of an input signal to a filter so as to adjust peak or dip frequencies of a filter characteristic curve or cut-off frequencies to a prescribed value. In such case, the obtained characteristic curve is observed artificially to determine the cut-off frequencies or the peak or dip frequencies. Then, a filter adjustment is executed manually such that the frequencies reach the prescribed target value.

In the event of automating such filter adjustment, it should be noted that a difficulty arises for mechanically discriminating and reading said peak, dip or a cut-off points, which sometimes result in a lowered adjustment accuracy. Moreover, the structure for sweeping frequencies of an input signal becomes complicated. It is troublesome enough to repeat such sweeping while gradually changing the filter characteristics, spending considerable time for adjustment.

OBJECT OF THE SUMMARY OF THE INVENTION

It is an object of the present invention to provide for a filter adjustment with improved accuracy and shortened time with a simplified structure.

In accordance with the apparatus and method of the present invention, a signal of a constant frequency is supplied from an input signal source, and filter characteristics are changed corresponding to the filter adjustment data in a filter circuit. The output from the filter circuit is level-detected by a level detecting means. The output therefrom is then compared and discriminated with the prescribed reference level. Then a control means determines the optimum filter adjustment data when the filter adjustment data are changed, based on the filter adjustment data at the time of an inversion of the output from the comparing means.

Stated conversely, it is a feature of the invention to find the optimum data based on the filter adjustment data at the time the filter output level crosses a reference level, while maintaining a constant input signal frequency and changing the filter characteristics. With this feature, even the simplified structure can realize a reduction of the adjusting time and improve the accuracy. Furthermore, the application to the automatic adjustment can be facilitated.

Other objects and advantages of the invention will be apparent in the following description, the appending claims and the accompanying drawings.

DESCRIPTION OF A PREFERRED EMBODIMENT

Figure 1:
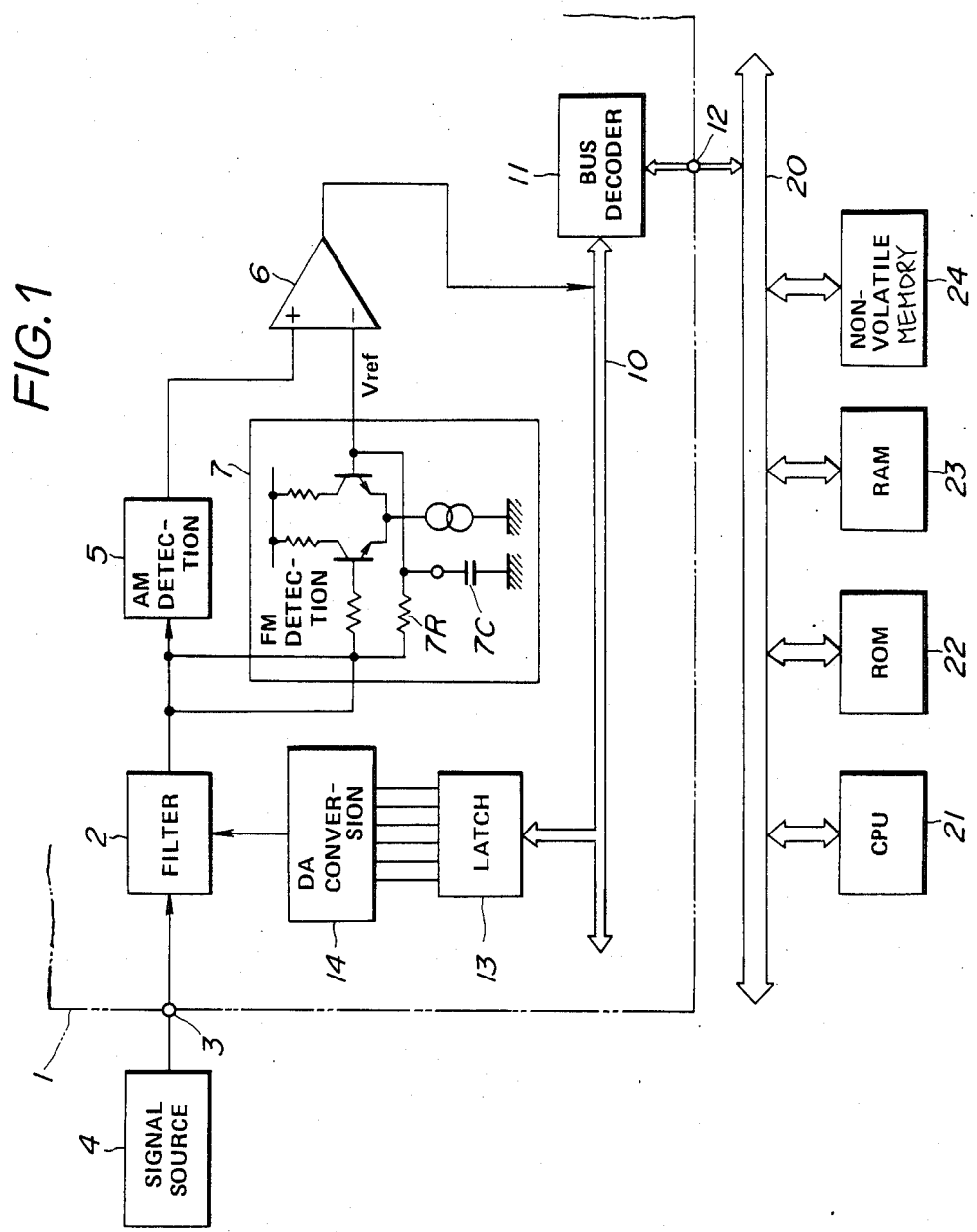
FIG. 1 is a circuit diagram showing an embodiment of a filter adjustment apparatus to which the present invention is applied.

FIG. 1 is a block diagram showing an embodiment of a filter adjustment apparatus. Referring to the drawing, it will be seen that a filter 2 to be adjusted by the present adjustment apparatus is provided in an analog integrated circuit 1 such as IC for sound multiplex demodulation used, for example, in a television receiver.

Figure 2:
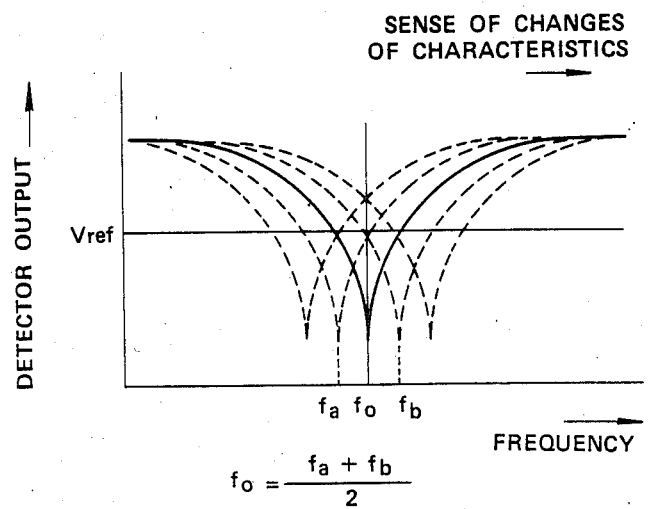
FIG. 2 illustrates the frequency characteristics of a trap filter.

Referring to this figure, signals of a constant frequency $f_0$ from a signal source 4, such as sinusoidal waves, are supplied to the filter 2 through an exterior connection terminal 3, such as a so-called IC pin, of the analog integrated circuit 1. The filter 2 is constructed such that a circuit constant is variable corresponding to filter adjustment data, and that results in a change in the filter characteristics. As an example of the filter characteristics of the filter 2, what is called the trap characteristics are assumed in the present embodiment as shown in FIG. 2, thus providing the above-mentioned constant frequency $f_0$ as a desired value of the adjustment of dip frequencies of the trap characteristics. Stated conversely, in the present embodiment, the trap filter 2 is adjusted so as to set the dip frequency to equal the constant frequency $f_0$, when adjustment is completed.

According to the present embodiment, filter adjustment is performed in such a manner that the output from the filter 2 is supplied to, for example, an AM detector 5 as the level detecting means for detecting the signal level or amplitude, the so-detected AM output being supplied to one terminal, such as a non-inverting input terminal, of a comparator 6 for signal level discrimination. A prescribed reference level $V_{ref}$ is supplied to the other input terminal or an inverting input terminal of the comparator 6. In the comparator, it is determined whether the level of the detected AM output is higher or lower than the reference level $V_{ref}$. According to the present embodiment, the reference level $V_{ref}$ is obtained from the low pass filter portion of the FM detector 7 provided in the analog IC 1. To this FM detector 7 is supplied the output from the filter 2, the direct current component of which is taken out by a low pass filter of LPF usually provided in an input stage of the FM detector, that is, an RC circuit composed of an input resistance 7R and a capacitor 7C, this direct current signal level being supplied as the aforementioned reference level $V_{ref}$ to the comparator 6.

In such manner, in the present invention, since the low pass filter previously provided in the analog IC is used and the direct current component of the input signal is set as the reference level, the circuit construction is simplified. It also serves to prevent harmful influences to the level discriminating operation in the comparator 6 from occurring even if a direct current drift of the input signal, for example, is produced.

The output of comparison or the level discrimination output from the comparator 6 is supplied to the internal bus 10 within the IC 1. The bus decoder 11 connected to the internal bus 10 of the IC is also connected through a bus from an external connection 12 to an external bus 20 and used as an interfacing circuit for mutual conversion of the data on the external bus 20 and those on the internal bus 10. The data transmitted from the external bus 20 through the bus decoder 11 to the internal bus 10 are stored once in a latch circuit 13 and then converted into analog signals in a D/A converter 14, the resulting analog signals being supplied to the filter 2 as the circuit constant control signals or as the filter characteristics adjustment signals. To the external bus 20 are connected a CPU 21, such as a so-called microprocessor, the ROM 22 storing various programs and data, the RAM 23 for transient data storage and a non-volatile memory 24 for storage of data, such as the filter adjustment data, irrespective of the turning on or off of the power source. The computer system composed of the CPU 21, ROM 22, RAM 23 and the non-volatile memory 24 performs a series of control operations including storing the filter adjustment data depending on the outputs obtained from the comparator means when the filter adjustment data are changed, and determining the optimum filter adjustment data on the basis of the thus stored filter adjustment data. The filter adjustment for finding the aforementioned filter adjustment data is now explained. At the start, signals of a constant frequency from the signal source 4 are supplied to the filter 2. At this time the control means composed of a computer system such as the CPU 21 delivers the filter adjustment data to the circuit constant control terminal in the filter 2 through the bus decoder 11, the IC internal bus 10, the latch circuit 13 and the A/D converter 14.

These adjustment data represent a series of data for gradually shifting the characteristic curves of the filter 2 in one direction, for example, in the arrow mark direction as schematically indicated by the dotted lines in FIG. 2, on the frequency axis. It is noted that changing the frequency characteristics substantially continuously is tantamount to fixing the filter characteristics and to changing or sweeping the input signal frequency according to the prior art practice.

Figure 3:
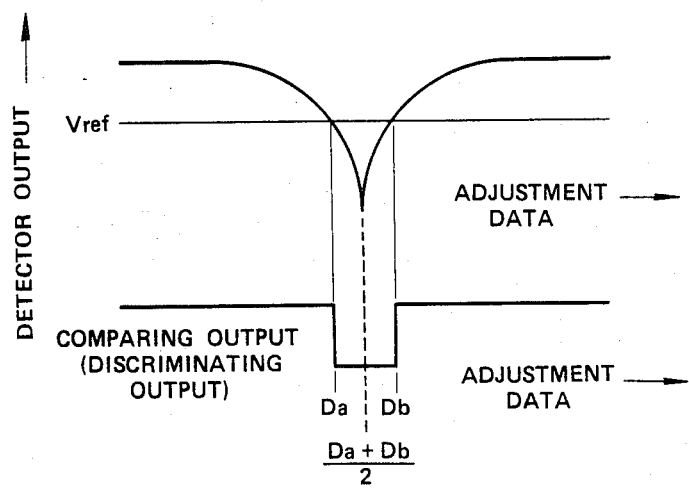
FIG. 3 illustrates a filter adjustment operation in accordance with the present invention.

Conversely, since the input signal frequency is fixed at the constant value $f_0$, the output obtained after level detection of the output signals from the filter 2 at the AM detector 5 is as shown, for example, at the detected output in FIG. 3. The detected output has its level changed in accordance with the changes in the filter adjustment data as indicated on the abscissa in FIG. 3. Thus the curve of the detected output corresponds to the filter characteristic curve of FIG. 2 when supposed that the curve is inverted in the left and right direction in FIG. 2 with the frequency $f_0$ as the center. This detected output is supplied to the non-inverting input terminal of the comparator 6 for comparison with the reference level $V_{ref}$ to produce the comparator output as shown in FIG. 3. When assumed that the filter adjustment data obtained at the inverting position of the comparator output, that is, when the detected output crosses the reference level $V_{ref}$, are sequentially denoted as Da and Db, the optimum adjustment data when the dip frequency of the trap characteristics coincides with the aforementioned frequency $f_0$ is obtained from the mean value of the data Da and Db, or (Da+Db)/2. That is, the data Da generates the filter characteristic curve having the trap frequency $f_a$ in FIG. 2 while the data $D_b$ generates the filter characteristic curve having the trap frequency $f_b$ in FIG. 2. Accordingly, there is obtained the characteristic curve with $f_0$ in FIG. 2 as the trap frequency due to the data $(D_a+D_b)/2$. This optimum adjustment data are written in the non-volatile memory 24 of FIG. 1 and preserved even when the power source is turned off. As one of the usual initializing operations performed at the time the power source is turned on, the aforementioned optimum adjustment data stored in the nonvolatile memory 24 are transmitted to the latch circuit 13 for establishing the optimum adjustment state of the filter 2.

As stated above, according to the present invention, since the input signal frequency is fixed at the constant value $f_0$, and the frequency characteristics are gradually changed shifting the characteristic curve in the direction of the frequency axis, the conventional structure for the frequency sweeping can be eliminated. Besides, time for adjustment is reduced as it becomes unnecessary to repeat sweeping during adjusting the filter characteristics. In addition, it is possible to obtain the optimum filter adjustment data with high accuracy by a simpler circuit structure adapted for detecting the crossing point of the reference level by the filter output, with the monitoring of the characteristic curve being also eliminated, while the circuit can be easily adapted to automatic adjustment with the use of the bus lines.

Figure 4:
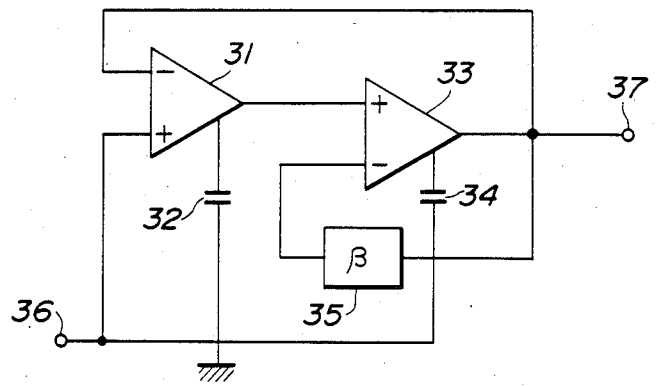
FIG. 4 is a circuit diagram showing an example of a biquad filter.

It is noted that, as the filter 2 incorporated into the integrated circuit, the so-called biquad filter as shown, for example, in FIG. 4, is most popular. The biquad filter is an active filter consisting of a series connection of a first integrator composed of an operational amplifier 31 and an integrating capacitor 32 and a second integrator composed of an operational amplifier 33 and a capacitor 34. The output of the operational amplifier 31 is supplied to the non-inverting input terminal of the operational amplifier 33 while the output of the operational amplifier 33 is fed back to the inverting input terminal of the operational amplifier 33 and the output of the operational amplifier 33 is fed back to the inverting input terminal of the operational amplifier 33 and the output of the operational amplifier 33 is fed back to the inverting input terminal of the operational amplifier 33 through a feedback circuit 35 having a feedback factor equal to $\beta$.

It is noted that the characteristics of a BPF, LPF, HPF, trap or phase shifters can be realized by suitably selecting whether input signals should be supplied to the non-inverting input terminal of the operational amplifier 31 or to capacitors 32, 34 or the terminal or capacitors should be grounded.

In the embodiment shown in FIG. 4, input signals are supplied through the terminal 36 to the non-inverting input terminal of the operational amplifier 31 and to the capacitor 34 while the capacitor 32 is grounded and the output signals are taken at an output terminal of the operational amplifier 33 to provide a trap filter.

Also the input signals can be supplied only to the non-inverting input terminals of the operational amplifier 31, while both the capacitors 32, 34 can be grounded and the output signals taken out at the operational amplifier 33 to provide an LPF.

Figure 5:
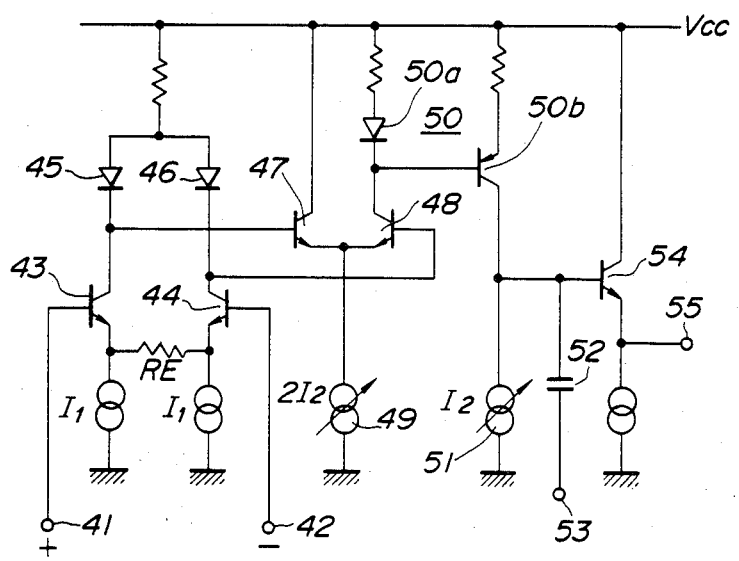
FIG. 5 is a circuit diagram showing a practical example of an integrator used in the filter shown in FIG. 4.

FIG. 5 shows an example of an integrator used in the above biquad filter. Referring to FIG. 5, the non-inverting input terminal 41 and the inverting input terminal 42 of the operational amplifier are connected to the base terminals of transistors 43, 44 cojointly forming a differential amplifier. The current flows in a resistor RE connected between the emitters of these transistors 43, 44 with a magnitude related to the input voltage between the terminals 41 and 42. The current equal to the sum of the current I1, I1 of the constant current sources connected to the emitters of the transistors 43, 44 and the current equal to the difference between the currents I1, I1 flow respectively through diodes 45 and 46 connected to the collectors of the transistors 43, 44, respectively. The terminal voltages of these diode 45, 46 appearing as a function of these currents are applied to the base electrodes of transistors 47, 48 cojointly forming an emitter common differential transistor pair. The common emitter of these transistors 47, 48 is grounded via a constant current source 49 of the current 2I2, such that the signal current flowing at the collector side of the differential transistor pair is amplified by a factor of I2/I1e of the signal current flowing resistance RE. The collector output of the transistor 48 is taken through a current mirror circuit 50 for charging the capacitor 52 used as the aforementioned integration capacitance. The voltage at one end of the capacitor 52 is inputted to a transistor 54 so as to be taken at an output terminal 55. The other side 53 of the capacitor 52 may be grounded, as described above, an input signal is supplied thereto.

In the configuration of the integrating circuit shown in FIG. 5, by changing the current I2 of the current source 51 on the output sides of the current mirror circuit 50 and the constant current source 49, the frequency characteristics of the biquad filter in FIG. 4, or rather, dip frequencies of the trap filter present changes shown in FIG. 2. That is, the filter adjustment data from the control means consists of the aforementioned CPU 21, etc. as shown in FIG. 1, are supplied to the filter 2 through the latch circuit 13, and the DA converter 14, etc. so as to control the current I2 of the constant current source in the internal circuit. These whole processes result in a parallel displacement of the characteristic curves along the frequency axis, as explained before.

Figure 6:
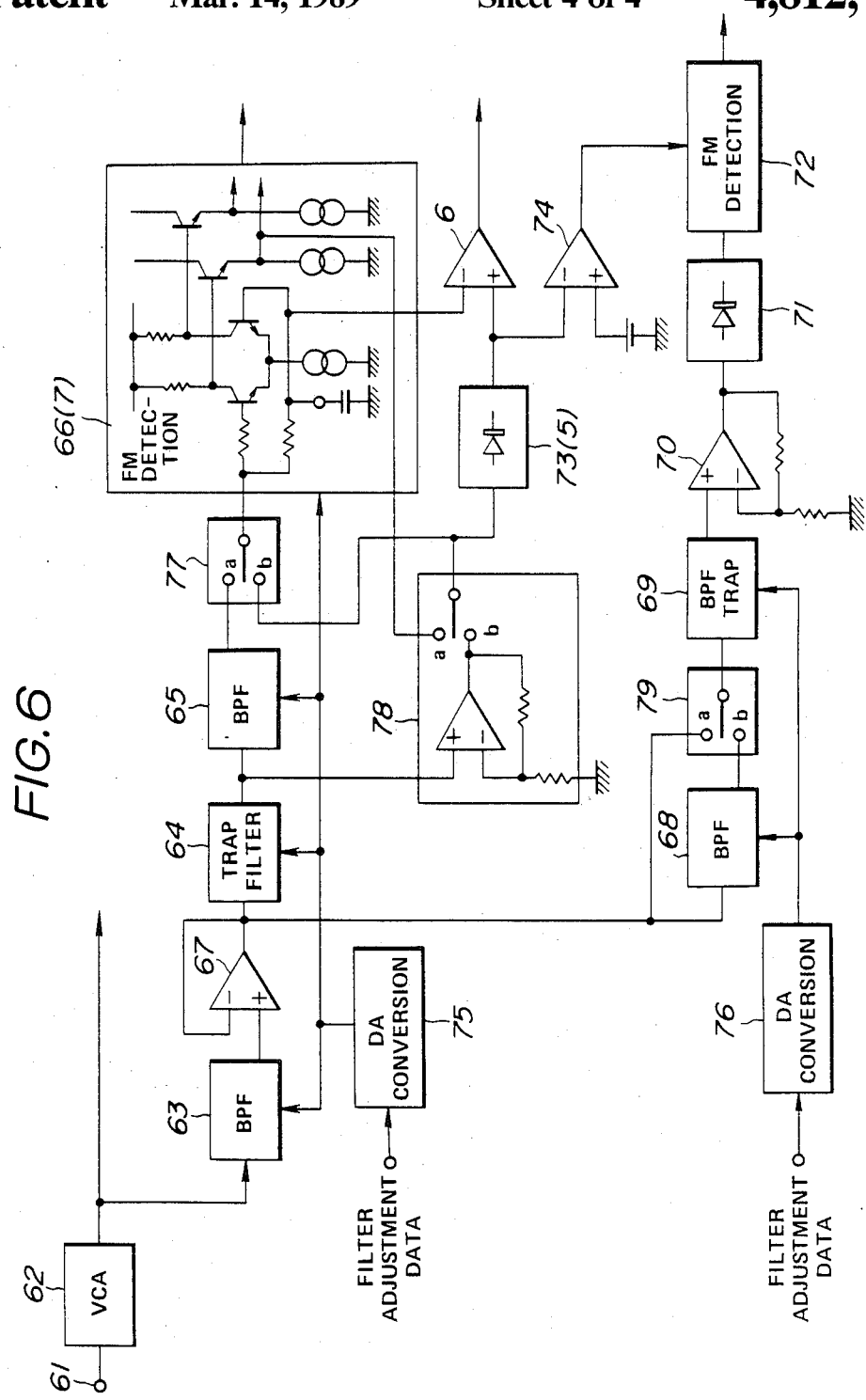
FIG. 6 is a circuit diagram showing a practical example of an analog IC to which the present invention is advantageously applied.

The substantial parts of the integrated circuit (IC) for sound multiplex demodulation as a practical example of the analog IC for application of such automatic filter adjustment, are explained briefly by referring to FIG. 6.

In this figure, an input terminal 61 is used as a signal input terminal of an integrated circuit (IC) for sound multiplex demodulation. Thus, the sound multiplex signals obtained upon reception of the television sound multiplex broadcasting, for example, are supplied to the terminal 61. The sound multiplex signals supplied to the terminal 61 are amplified by a voltage controlled amplifier (VCA) so as to be then supplied to a main signal system, a sub signal system and to a control signal system. The sub signal system has a BPF circuit composed of a BPF 63, a trap filter 64 and a BPF 65 and manifesting bandpass characteristics in its entirety, and an FM detector 66, and is so designed as to take out the output from the FM detector 66 as the sub voice through an LPF circuit and a de-emphasis circuit, not shown. The control signal system is composed of a BPF 68 to which is supplied an output from an amplifier 67 connected between the BPF 63 and the trap filter 64, a filter 69 manifesting bandpass (BP) and trap characteristics, an AM detector 71 to which is supplied an output from the filter 69 through an amplifier 70, and an FM detector 72 to which is supplied an output from the AM detector 71. For more reliable detection of the sound multiplex mode, the output appearing in the vicinity of the output stage of the limiting amplifier of the FM detector 66 of the sub signal system is supplied to an AM detector for level detection and thence to a comparator circuit 74 for determining the presence or absence of the sound multiplex subcarrier. The output from the comparator 74 is supplied to an operation inhibit or defeat terminal of the FM detector 72 of the control signal system for controlling the FM detector 72 to an inoperative state in case the sound multiplex subcarrier is not detected.

In the circuit of FIG. 6, DA converters 75, 76 are provided, as characteristic of the present embodiment. The function of the D/A converter 75 is to control the magnitude of the current of the aforementioned constant current source to thereby control the frequency characteristics of the FM detector 66 and the filter 63, 64 and 65 of the sub signal system, whereas that of the D/A converter is to control the frequency characteristics of the filters 68 and 69 of the control signal system. Changeover switches 77, 78 and 79 are connected between the FM detector 66 and the BPF 66 of the sub signal system, between the trap filter 64 and the AM detector 73 and between the BP and trap filter 69 and the BPF 68 of the control signal system, respectively, with a movable contact being shifted to the select terminals a and b for usual sound multiplex signal demodulation and for filter adjustment, respectively. That is, during the mode of demodulation of the sound multiplex signals, the changeover switches 77, 78 and 79 are commutated to the side of the select terminal a, the output from the BPF 65 is supplied to the FM detector 66, the output of the limiting amplifier of the FM detector 66 is supplied to the AM detector 73 and the output from the BPF 68 is supplied to the BP and the trap filter 69. During the mode of filter adjustment, as described hereinabove, the output from the trap filter 64 is amplified by an amplifier-changeover switch 78 as to be then supplied to the AM detector 73 and the changeover switch 77, while the output from the changeover switch 77 is supplied to the FM detector 66 and the output from the amplifier 67 is directly supplied to the BP and trap filter 69 of the control signal system. During this filter adjustment, the BPF 65 of the subsignal system is by-passed while the output from the trap filter 64 is level-detected in an AM detector 73 corresponding to the AM detector 5 of FIG. 1 and transmitted to a comparator 6 where it is compared to the direct current level V_{ref} from the RC circuit of the FM detector 66 corresponding to the FM detector 7 of FIG. 1. In the control signal system, the BPF 68 is by-passed so that the characteristics of the BP and trap filter 69 may be displayed more definitely.

The present invention is not limited to the above described specific embodiments, but may comprise various other modifications. For example, according to the present invention, the detection of peak frequencies of the BPF can be executed in the same manner. It is also possible to change or modify various filter characteristics without departing from the scope or spirit of the invention as defined in the appended claims.

What is claimed is:

1. A filter adjustment apparatus comprising:
   a filter circuit,
   means responsive to variable filter adjustment data for adjusting the filter characteristics of said filter circuit;
   an input terminal for supplying a constant frequency input signal;
   a level detecting means for detecting an output produced by the filter circuit;
   a comparator means connected to said level detector and to a reference level for producing a signal corresponding to the difference between an output of said level detector and said reference level; and
   a control means connected to said comparator means for determining optimum filter adjustment data based on the signal from the comparator means,
   said control means responds to the output from the comparator means when the filter adjustment data are changed, while said filter circuit is supplied with said constant frequency input, and determining the optimum filter adjustment data based on the output thus detected.

2. A filter adjustment apparatus according to claim 1, wherein said filter is a trap type filter having a trap frequency which is changed by said filter adjustment data, with said optimum filter adjustment data being equal to the mean of two values of filter adjustment data which are obtained when said difference is zero.

3. A filter adjustment apparatus according to claim 1, including an external bus line, and wherein said filter circuit, said input terminal, said level detecting means and said comparator means are all provided within a single IC, and wherein said control means supplies said filter circuit with said variable filter adjustment data through said external bus line and said detected output is supplied to the control means through said external bus line.

4. A filter adjustment apparatus according to claim 3, wherein said IC has an FM detecting circuit having a low pass filter, said low pass filter being connected to receive the output of said filter circuit, and said low pass filter being connected to supply a reference level to said comparator means.

5. A filter adjustment method comprising the steps of:
   supplying a filter circuit provided in an IC with an external constant frequency signal;
   supplying the filter circuit with adjustment data through an external bus line of the IC from a control means;
   supplying a level detecting means with an output of the filter circuit;
   comparing an output of the level detecting means with a reference level;
   supplying the control means with a compared output through the external bus line; and
   said adjustment data from said control means defining optimum characteristics of the filter circuit at times determined by said compared output.

6. A filter adjustment method according to claim 5, wherein said filter is a trap type filter having a trap frequency which is changed corresponding to said filter adjustment data including the steps of obtaining two data values when the output of the level detector crosses the reference level and defining the optimum characteristics of the filter circuit by obtaining the mean value of said two data values.

7. A filter adjustment method according to claim 6, including the step of storing said mean value in a non-volatile memory for subsequent use as adjustment data.

* * * * *